US007523037B2

(12) United States Patent
Sakata

(10) Patent No.: US 7,523,037 B2

(45) Date of Patent: Apr. 21, 2009

(54) DATA SYNTHESIS APPARATUS AND PROGRAM

(75) Inventor: Goro Sakata, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 513 days.

(21) Appl. No.: 11/285,601

(22) Filed: Nov. 21, 2005

(65) Prior Publication Data

US 2006/0111908 A1 May 25, 2006

(30) Foreign Application Priority Data

Nov. 25, 2004 (JP) ............................ 2004-339752

(51) Int. Cl.

*G10L 21/00* (2006.01)
*G10L 19/14* (2006.01)
*G10L 13/00* (2006.01)
*H03G 3/00* (2006.01)
*G10H 1/00* (2006.01)

(52) U.S. Cl. ....................... 704/272; 704/211; 704/258; 381/61; 84/600

(58) Field of Classification Search ....................... None
See application file for complete search history.

(56) References Cited

U.S. PATENT DOCUMENTS 3,825,685 A * 7/1974 Roworth ...................... 381/54
4,177,707 A * 12/1979 Boucher ...................... 84/603
5,014,589 A * 5/1991 Obata .......................... 84/735
5,463,691 A * 10/1995 Nakae et al. .................. 381/61
6,513,007 B1 * 1/2003 Takahashi ................... 704/258
6,816,833 B1 * 11/2004 Iwamoto et al. ............. 704/207

FOREIGN PATENT DOCUMENTS

JP 2-262698 A 10/1990
JP 04-093996 A 3/1992
JP 2800465 B2 12/1992
JP 09-101786 A 4/1997
JP 2819533 B2 8/1998
JP 2001-265400 A 9/2001

OTHER PUBLICATIONS

Oppenheim et al., "Discrete-Time Signal Processing", 2nd Edition, Upper Saddle River, NJ: Prentice-Hall, 1999.*
Japanese Office Action (and English translation thereof) dated Jun. 10, 2008. issued in a counterpart Japanese Application.

* cited by examiner

*Primary Examiner*—David R Hudspeth
*Assistant Examiner*—Brian L Albertalli
(74) *Attorney, Agent, or Firm*—Frishauf, Holtz, Goodman & Chick, P.C.

(57) ABSTRACT

A data synthesis apparatus detects the start of a period of voice waveform data, stores the voice waveform data in a first storage device, starting with its part indicative of the start of the detected period. The apparatus stores in a second storage device musical-sound waveform data including information on pulses having a specified period, and then performs a convolution operation on the voice waveform data stored in the first storage device and the musical-sound waveform data stored in the second storage device, thereby outputting synthesized waveform data synchronized with the specified period of the musical-sound waveform data stored in the second storage device.

2 Claims, 19 Drawing Sheets

DATA SYNTHESIS APPARATUS AND PROGRAM

CROSS-REFERENCE TO RELATED APPLICATIONS

This application is based upon and claims the benefit of priority from the prior Japanese Patent Application No. 2004-339752, filed on Nov. 25, 2004, the entire contents of which are incorporated herein by reference.

BACKGROUND OF THE INVENTION

1. Field of the Invention

The present invention relates to data synthesis apparatus and programs, and more particularly to such apparatus and programs that synthesize voice and musical sound data.

2. Description of the Related Art

In the past, vocoders are known which convert the pitch of a human being's voice to that of a sound that will be produced from a keyboard instrument. The vocoder divides voice waveform data of the human being's voice inputted thereto into a plurality of frequency components, analyses musical sound waveform data outputted from the keyboard instrument, and then synthesizes the voice and musical-sound waveform data. As a result, a tone of the human being's voice can be produced with a corresponding pitch of a musical sound to be produced by the instrument.

Japanese Patent No. 2800465 discloses an electronic musical instrument that performs as a musical sound a song to be sung by a human being, using such data synthesis. The electronic instrument of this patent comprises a keyboard that generates pitch specifying information, a ROM that has stored a plurality of items of time-series formant information characterizing the voices uttered by a like number of human beings, and a formant forming sound source, responsive to generation of pitch specifying information by the keyboard, for reading out the plurality of items of time-series formant information sequentially from the ROM and for forming a voice from the pitch specifying information and the sequentially read plurality of items of formant information.

The formant represents a spectrum distribution of human being's voice, characterizing the same. Analysis of the frequencies of the human being's voice clarifies that a different pronunciation has a different spectrum. On the other hand, when different persons utter the same sound, their spectra are the same. For example, when several persons utter "ə" (phonetic sign) individually, we can hear the same sound "ə" irrespective of the natures of their voices because the spectra of "ə" have the same spectrum distribution.

The formant information storage means composed of ROM 15 of FIG. 1 of the patent comprises a syllable data sequence table, which comprises a frequency sequencer and a level sequencer and which has stored main four time-series formant frequencies F1-F4 and levels (or amplitudes) L1-L4 that characterize the respective syllables (including the Japanese syllabary, respective voiced consonants, and p-sounds in the kana syllabary) of human being's voice. Thus, a human being's voice having a pitch specified by the keyboard is synthesizable. Simultaneous utterance of the same voices with different pitches, or chorus, is possible.

In this case, a formant synthesis apparatus disclosed in another patent publication (identified by TOKKAIHEI No. 2-262698) is used as a formant forming sound source. The formant synthesis apparatus is disclosed in FIG. 1 of this publication comprises a pulse generator 1, a carrier generator 2, a modulated waveform generator 3, adders 4 and 5, a logarithm/antilog conversion table 6, and a D/A converter 7. A formant sound is synthesized based on a formant central frequency information value Ff, a formant basic frequency information value Fo, formant form parameters (including band width values ka and kb, and shift values na and nb) and envelope waveform data indicative of the formant sound that are received externally. A phase accumulator 11 of the pulse generator 1 accumulates formant basic frequency information values Fo in synchronization with clock pulses ϕ having a predetermined period. In carrier generator 2, a phase accumulator 21 accumulates formant central frequency information values Ff sequentially in synchronization with clock pulses ϕ and outputs resulting values sequentially as read address signals for a sinusoidal memory 22.

Thus, it is easy to synthesize the voice waveform data read from the ROM and the musical-sound waveform data obtained from the keyboard. However, for example, when man's voice data from a microphone is received or voice data is read from a memory that has stored the man's voice data received from the microphone, the periods of their voice waveform data are not clear. Thus, phase discrepancy would occur and normal data synthesis cannot be achieved. In addition, there is a possibility that overtone data contained in the voice data will be detected erroneously as representing a keynote and subjected to data synthesis. Thus, a voice to be outputted would be distorted.

SUMMARY OF THE INVENTION

The present invention solves such problems. It is an object of the present invention to output distortionless synthesized waveform data having a formant that represents the features of a human being's voice by synthesizing performance waveform data and voice waveform data based on its keynote either obtained from a microphone or read from a memory that has stored voice data picked up by the microphone.

In a first aspect of the present invention, a data synthesis apparatus detects the start of a period of voice waveform data, and stores the voice waveform data in first storage means, starting with the start of the detected period. The apparatus also stores musical-sound waveform data including pulses having a specified period in second storage means, performs a convolution operation on the voice waveform data stored in the first storage means and the musical-sound waveform data stored in the second storage means, thereby outputting synthesized waveform data synchronized with the specified period of the pulses of the musical-sound waveform data stored in the second storage means.

In a second aspect of the present invention, a data synthesis program detects the start of a period of voice waveform data, and stores the voice waveform data in first storage means, starting with the start of the detected period. The program also stores musical-sound waveform data including pulses having a specified period in second storage means, performs a convolution operation on the voice waveform data stored in the first storage means and the musical-sound waveform data stored in the second storage means, thereby outputting synthesized waveform data synchronized with the specified period of the pulses of the musical-sound waveform stored in the second storage device.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Now, first and second embodiments and their modifications of a data synthesis apparatus according to the present invention will be described, using an electronic keyboard instrument as an example.

First Embodiment

Figure 1:
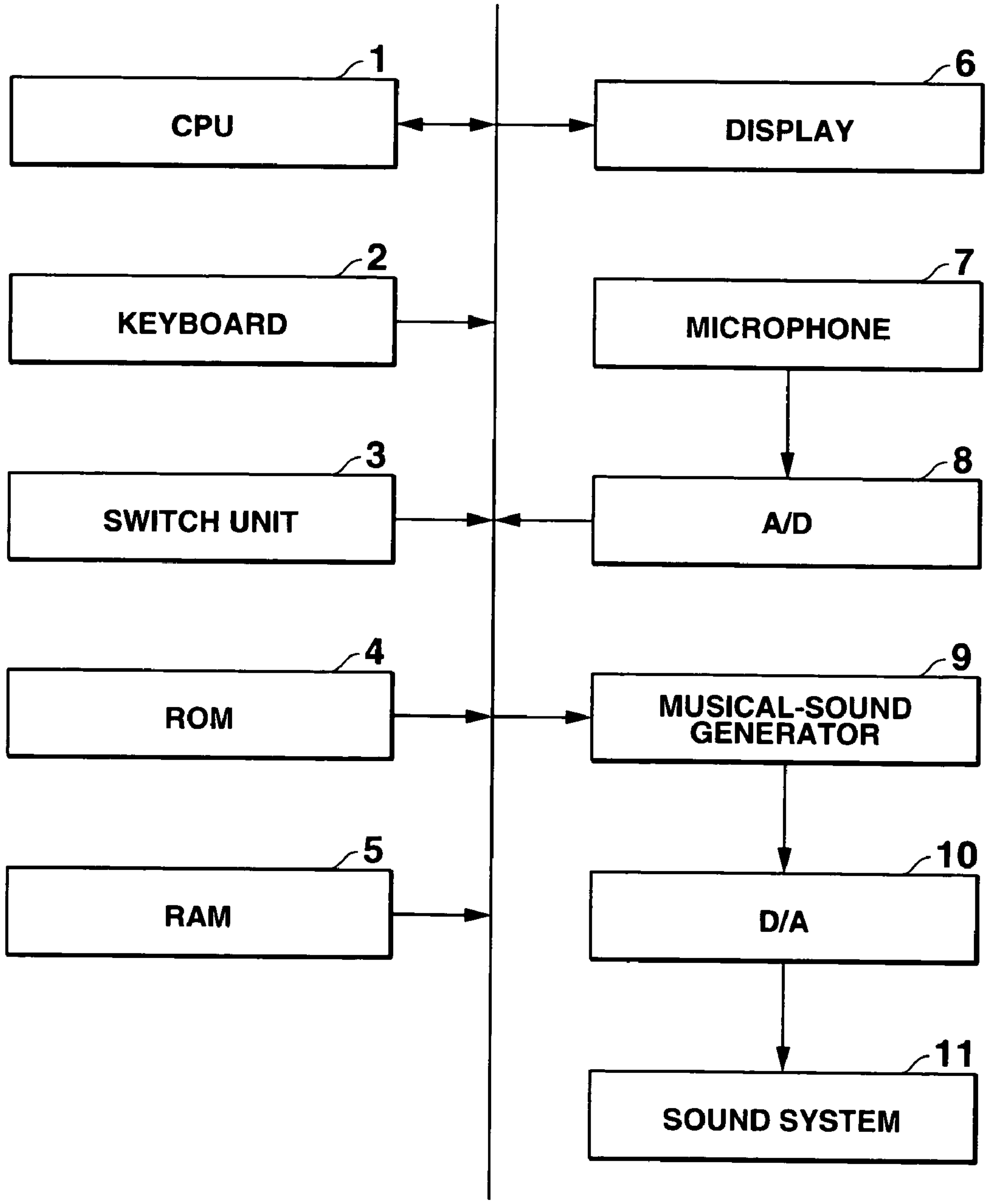
FIG. 1 is a block diagram of an electronic keyboard instrument as a first embodiment.

FIG. 1 is a block diagram of an electronic keyboard instrument as the first embodiment. A CPU 1 is connected via a system bus to a keyboard 2, a switch unit 3, a ROM 4, a RAM 5, a display 6, an A/D converter 8, and a musical-sound generator 9 such that CPU 1 gives/receives commands and data to/from the respective elements concerned, thereby controlling the whole instrument. A microphone 7 is connected to A/D converter 8. Musical-sound generator 9 is connected to a D/A converter 10 that is, in turn, connected to a sound system 11 that includes an amplifier and a speaker (not shown).

Keyboard 2 inputs to CPU 1 signals indicative of the pitch of a sound corresponding to depression of a key of the keyboard and an intensity or velocity of the key depression. Switch unit 3 comprises a plurality of switches including a start switch and a data synthesis switch. ROM 4 has stored a data synthesis program to be executed by CPU 1 and initial values of various variables. RAM 5 is a working area for CPU 1 and includes an area that temporarily stores data to be synthesized, registers, flags and variables necessary for execution of the data synthesis process. Display 6 displays messages for the data synthesis. A/D converter 8 converts a voice signal received from microphone 7 to digital voice waveform data that is then inputted to CPU 1. Musical-sound generator 9 generates a musical-sound signal in accordance with the waveform data received from CPU 1 and then inputs it to D/A converter 10, which converts the musical sound signal received from musical-sound generator 9 to an analog signal that is then outputted to sound system 11 for letting off a corresponding sound.

Figure 2:
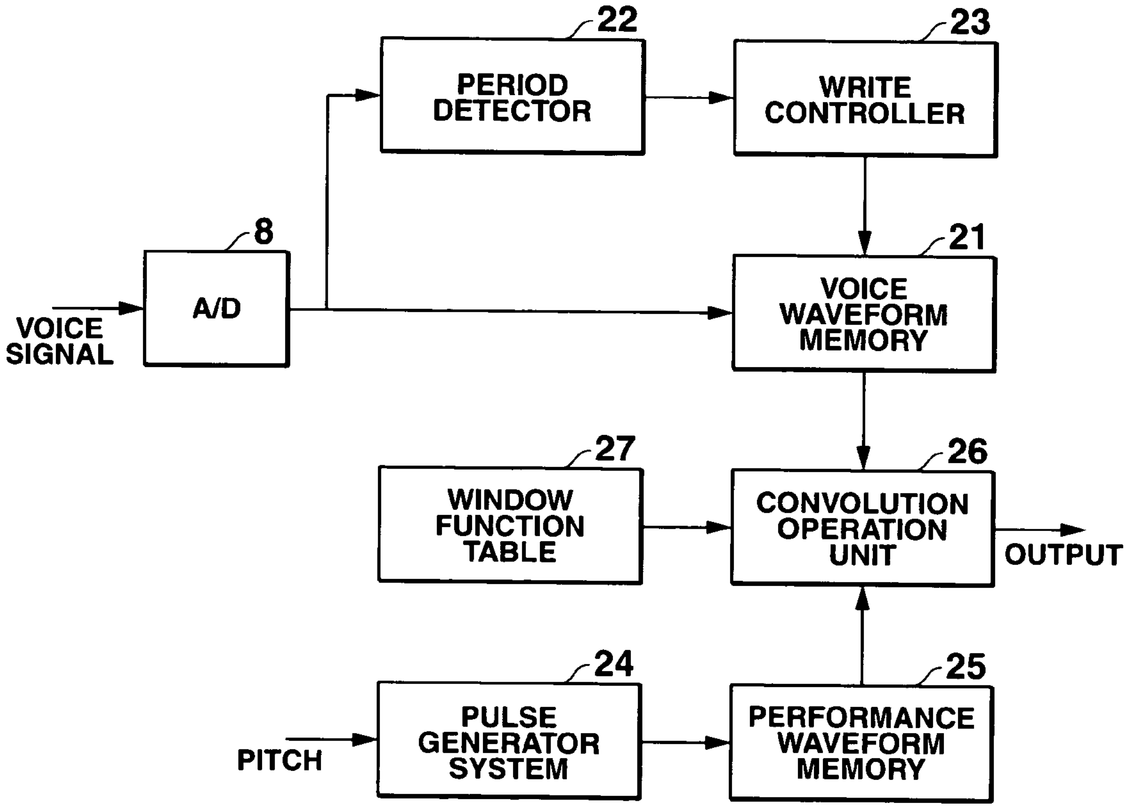
FIG. 2 is a block diagram of a data synthesis function of the first embodiment.

FIG. 2 is a block diagram indicative of the data synthesis function of the first embodiment. A/D converter 8 samples an analog voice signal, indicative of a human being's voice obtained from microphone 7, at a predetermined sample frequency, for example, of 44.1 kHz and then provides respective sampled digital voice waveform data of a predetermined number of (for example, 16) bits sequentially to voice waveform memory 21 for writing purposes. The voice waveform data comprises a series of successive periodic waveforms whose changing amplitudes correspond to changing pitches of a human being's voice, and hence comprises period information.

When the voice waveform data is written, period detector 22 detects the period of the voice waveform data and generates a corresponding periodic pulse. This pulse is then inputted to write controller 23, which controls writing the voice waveform data to voice waveform memory 21 in accordance with the periodic pulse. The data synthesis apparatus further comprises a pulse generator 24, a performance waveform memory 25, a convolution operation unit 26 and a window function table 27. In FIG. 2, voice waveform memory 21 and performance waveform memory 25 are each included in RAM 5 of FIG. 1. Each of pulse generator 24, period detector 22, write controller 23, and convolution operation unit 26 is realized by CPU 1 of FIG. 1. Window function table 27 is included in ROM 4 of FIG. 1.

Figure 3:
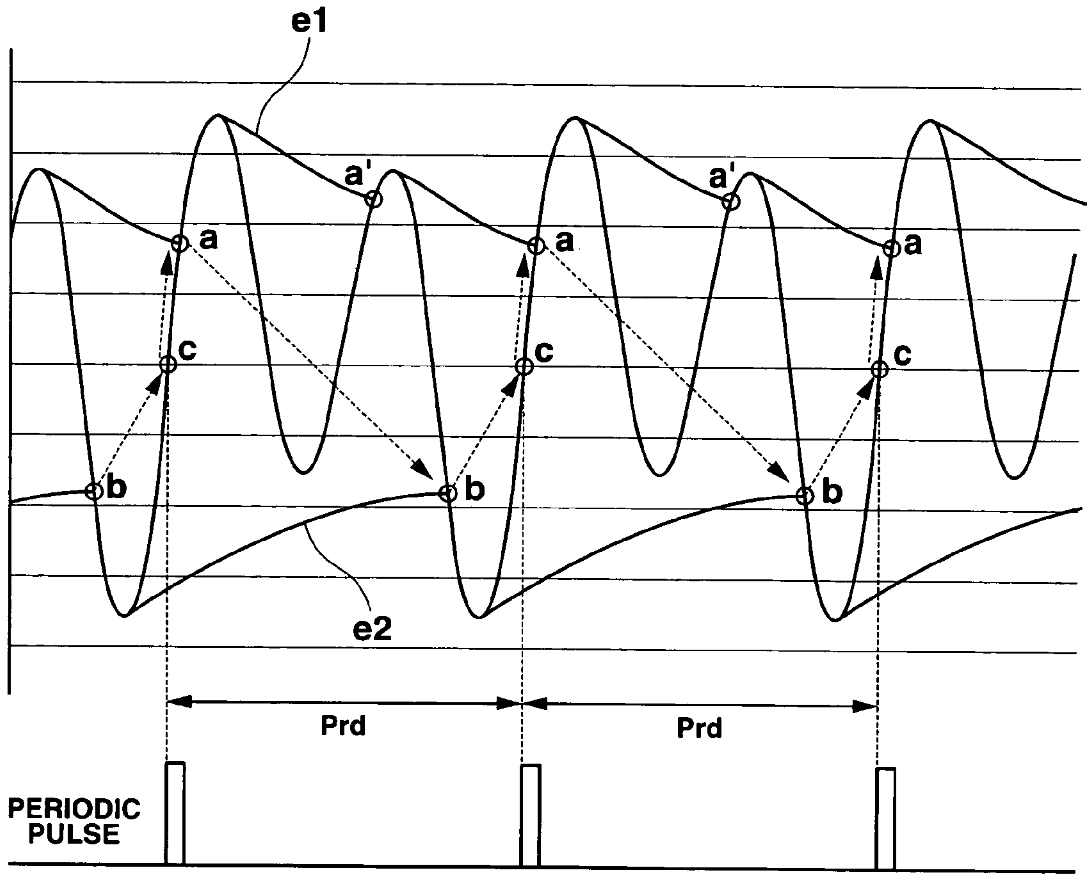
FIG. 3 illustrates a method of producing a periodic pulse by detecting the period of voice waveform data with a period detector of FIG. 2.

FIG. 3 illustrates how period detector 22 detects the period of the voice waveform data and generates a periodic pulse. The voice waveform data includes a keynote and overtones. Period detector 22 acquires the peak values of the positive and negative waveform data, respectively. These respective peak values will then attenuate with a predetermined attenuation coefficient. When intersecting with the voice waveform data whose amplitude increase in a positive or negative direction, the positive or negative peak value that has attenuated so far in turn increases along with amplitude of the voice waveform data. Then, when the respective next waveform peaks pass, they again attenuate, which will be repeated.

More specifically, period detector 22 detects a point a where the positive envelope amplitude value acquired by the peak-related holder and attenuating, as shown by e1 in FIG. 3, intersects with an amplitude of the voice waveform data increasing in the positive direction. Period detector 22 then detects a point b where the negative envelope amplitude value acquired by the peak-related value holder and attenuating, as shown in e2 in FIG. 3, intersects with the amplitude of the voice waveform data increasing in the negative direction. Then, the period detector 22 detects a point c which is a zero crosspoint where the voice waveform data changes from negative to positive, thereby generating a periodic pulse at point c. The amplitudes of the overtones are less than that of the keynote. Thus, even when the period detector 22 detects a point a' where the positive attenuating envelope peak holder value intersects with an increasing amplitude of the overtones of the positive voice waveform data after detection of point a, the period detector 22 does not detect the point c before detecting the point b due to the peak holder value for the negative envelope decreasing. Thus, as shown in FIG. 3, period detector 22 generates a periodic pulse at a predetermined period Prd of the keynote and then provides it to write controller 23.

Figure 4A:
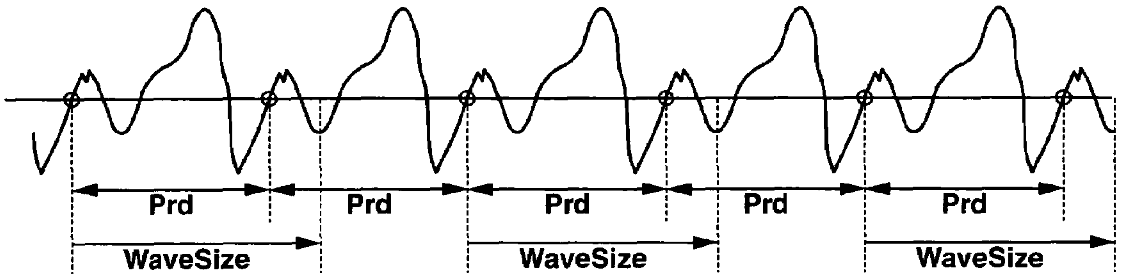
FIG. 4A illustrates the relationship in magnitude between the size of a voice waveform memory of FIG. 2 and the period of the voice waveform.
Figure 4B:
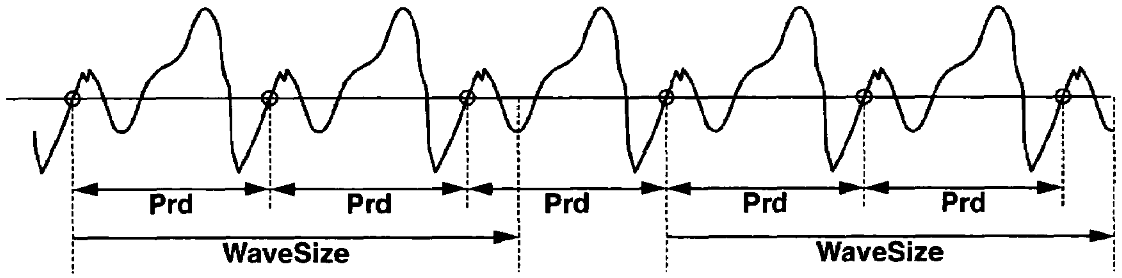
FIG. 4B illustrates the relationship in magnitude between the size of the voice waveform memory of FIG. 2 and the period of the voice waveform wherein the memory has a larger size than that of FIG. 4A.

Write controller 23 writes the periodic pulse as a start of the voice waveform data to voice waveform memory 21. Thus, voice waveform memory 21 is required to have a memory size WaveSize of at least one period of the voice waveform data. FIG. 4A shows a case in which the memory size of voice waveform memory 21 is greater than, or equal to, that required to store voice waveform data for one period and smaller than that required to store voice waveform data for two periods. FIG. 4B shows a case in which the memory size of voice waveform memory 21 is larger than that required to store voice waveform data for two periods and less than that required to store voice waveform data for three periods.

Figure 5:
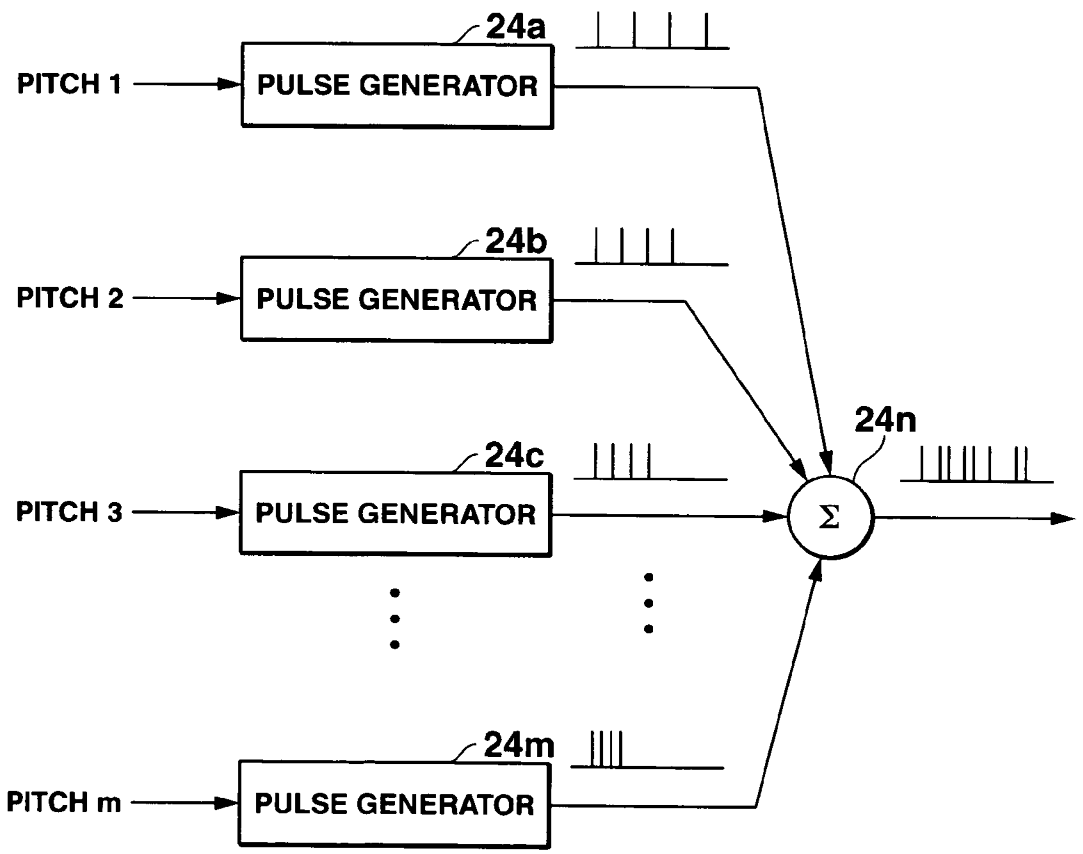
FIG. 5 illustrates the internal composition of a pulse generator of FIG. 2.

Pulse generator system 24 of FIG. 2 generates a pulse waveform depending on the pitch of a musical sound included in performance data received from keyboard 2 and writes it to performance waveform memory 25. FIG. 5 shows the internal structure of pulse generator system 24. When different keys of keyboard 2 are depressed simultaneously or in a timewise overlapping manner, corresponding performance data that can include a pitch of a chord or timewise overlapping different pitches will be produced. These data are inputted to a plurality of pulse generators 24*a*, 24*b*, 24*c*, . . . , 24*n*, respectively, which compose a pulse generate system 24 of FIG. 5. The pulse generators 24*a*, 24*b*, 24*c*, . . . , 24*m* generate respective pulse waveforms having different periods depending on the pitches 1, 2, 3, . . . , m of the musical sounds represented by the received plurality of performance data. An adder 24*n* synthesizes the different pulse waveforms and writes a resulting waveform to performance memory 25. When the volume should be controlled based on a velocity of key depression, the pulse waveforms may be multiplied by respective corresponding volume values.

Figure 6:
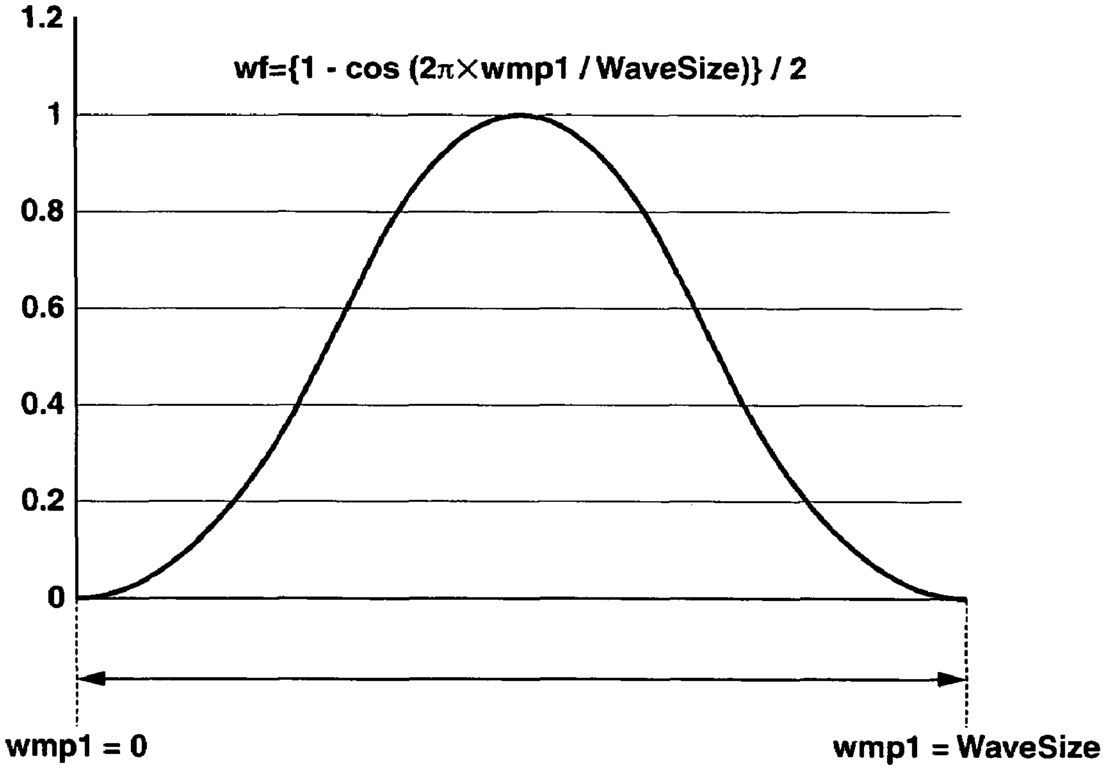
FIG. 6 illustrates a window function of a Hanning window stored in a window function table of FIG. 2.

A window function table 27 of FIG. 2 has stored outputs of a window function wf representing a Hanning window of FIG. 6. The window function is shown by:

$$wf=\{1-\cos(2\pi\times wmp1/\mathrm{WaveSize})\}/2$$

where wmp 1 represents a write pointer that increments by one each time one sample is written to voice waveform memory 21. Wmp 1 should sequentially take 0, 1, 2, . . . , and WaveSize-1 representing addresses of voice waveform memory 21, starting with its head address.

Figure 7:
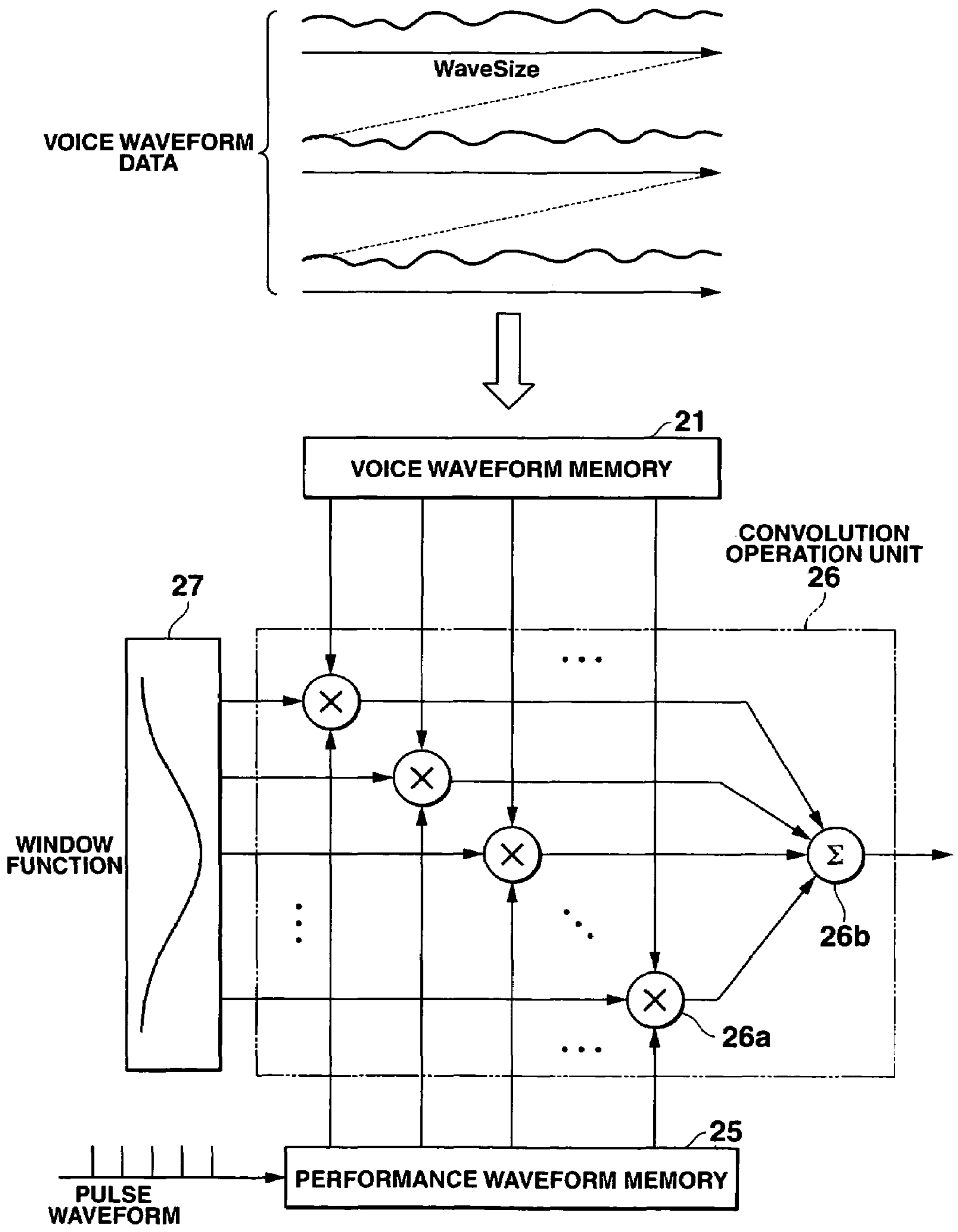
FIG. 7 illustrates the principle of a convolution operation to be performed by a convolution operation unit of FIG. 2.

FIG. 7 illustrates the principle of a convolution operation by convolution operation unit 26. Convolution operation unit 26 sequentially reads out a plurality of sampled values of voice waveform data of a memory size WaveSize one at a time from voice waveform memory 21 that has stored such voice waveform data, a like number of items of pulse waveform data of the memory size one at a time from performance waveform memory 25 that has stored such performance waveform data, and a like number of outputs of a window function of the memory size one at a time from window function table 27 that has stored such window function outputs, and sequentially performs a convolution operation on a like number of groups of read sampled voice value, performance waveform data item and window function output one group at a time at a like number of multipliers 26*a* selected sequentially selected one at a time, and then adds outputs from the respective multipliers 26*a*, thereby providing a resulting convolution-product output. When a pulse waveform is multiplied by a volume value of v bits, the number of bits representing the memory size WaveSize of performance waveform memory 25, m, is represented by:

$$m=v+\log_2 n.$$

Figure 8:
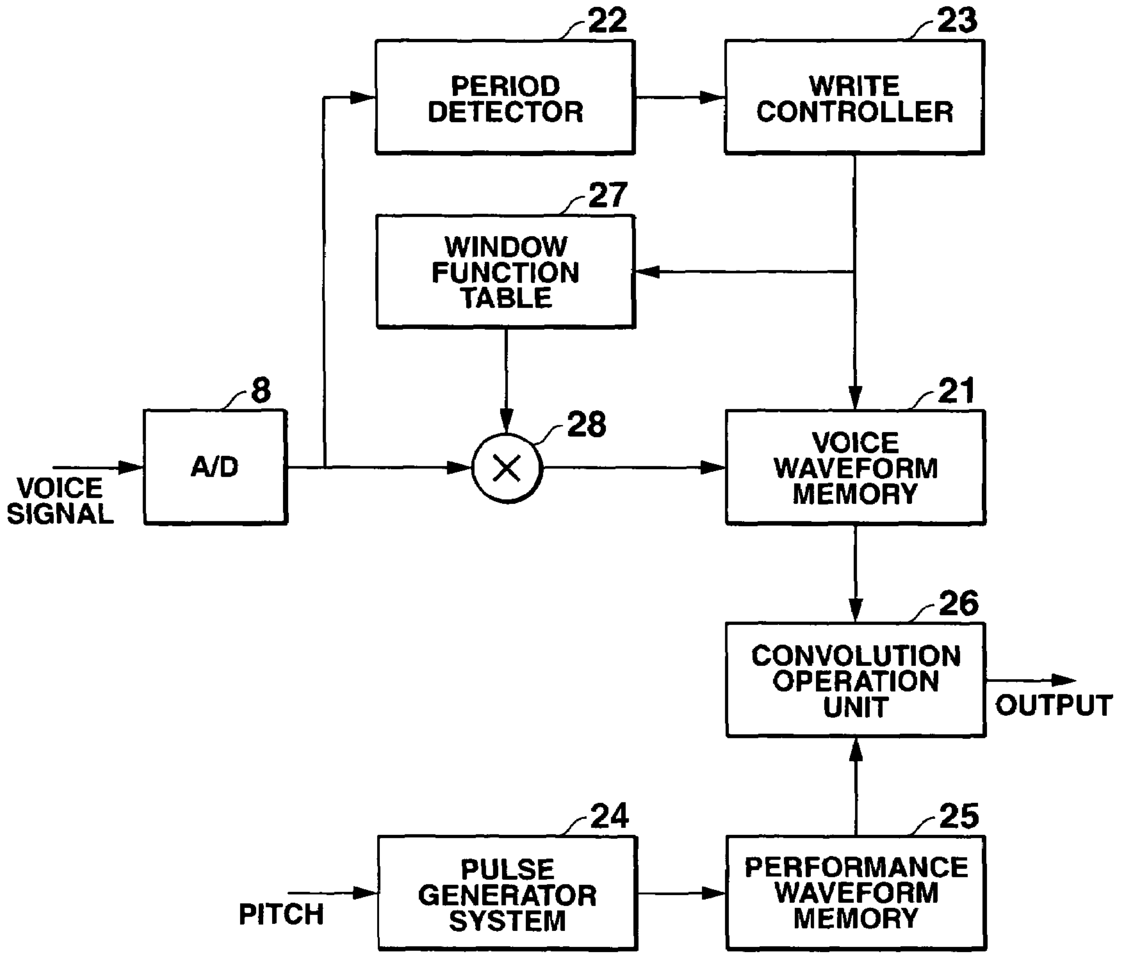
FIG. 8 shows a modification of the data synthesis function of the first embodiment shown in FIG. 2.

FIG. 8 illustrates a modification of the data synthesis function of FIG. 2. In FIG. 8, a multiplier 28 multiplies voice waveform data outputted from an A/D converter 8 by a window function output stored in window function table 27, and a resulting value is then written to voice waveform memory 21. Multiplier 28 is implemented by CPU 1. Thus, convolution operation unit 26 reads out the voice waveform data multiplied by a corresponding window function output stored in performance waveform memory 25 and then performs a convolution operation on them, thereby providing a resulting output. Note that the period detection of period detector 22 of FIG. 8 is different from that shown in FIG. 3.

Figure 9:
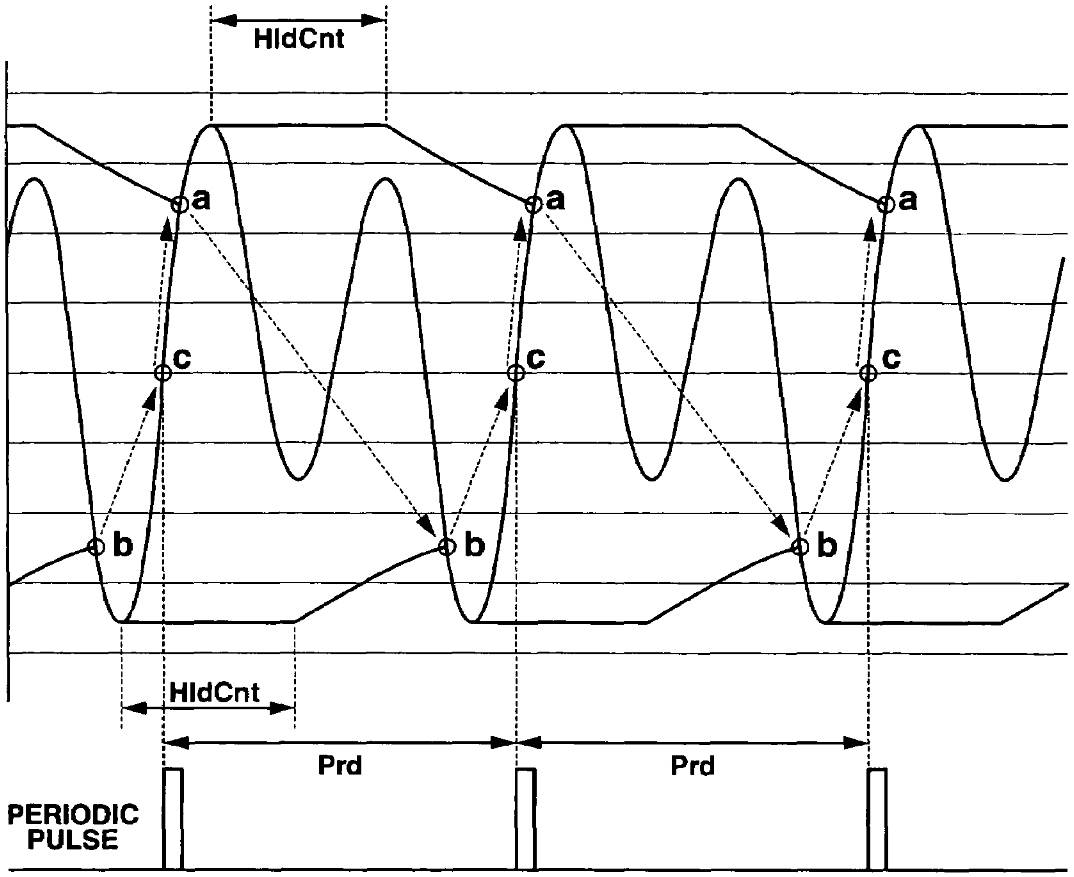
FIG. 9 illustrates a method of generating a periodic pulse by detecting a period of voice waveform data by a period detector of the FIG. 8 modification.

FIG. 9 shows a manner in which period detector 22 of the FIG. 8 modification detects the period of voice waveform data, thereby outputting a periodic pulse. Also in FIG. 9, period detector 22 detects a point a when a positive attenuating peak holder value of a positive envelope for the voice waveform data intersects with the voice waveform data, and then a point b where a negative attenuating peak holder value of a negative envelope for the voice waveform data intersects with the voice waveform data. Then, period detector 22 detects a zero crosspoint c where the voice waveform data changes from negative to positive, generates a periodic pulse at the period Prd of the keynote and then inputs it to write controller 23. Note that a time when the peak hold value starts to attenuate is a constant attenuation halt time HldCnt after the peak of the envelope. The time HldCnt is set to approximately half of the period of the periodic pulses. Thus, the probability of the apparatus operating erroneously based on the overtone is reduced compared to the case of FIG. 3. In this case, the time HldCnt is preferably set to approximately half of the pulse period to produce larger advantageous affects.

Figure 10A:
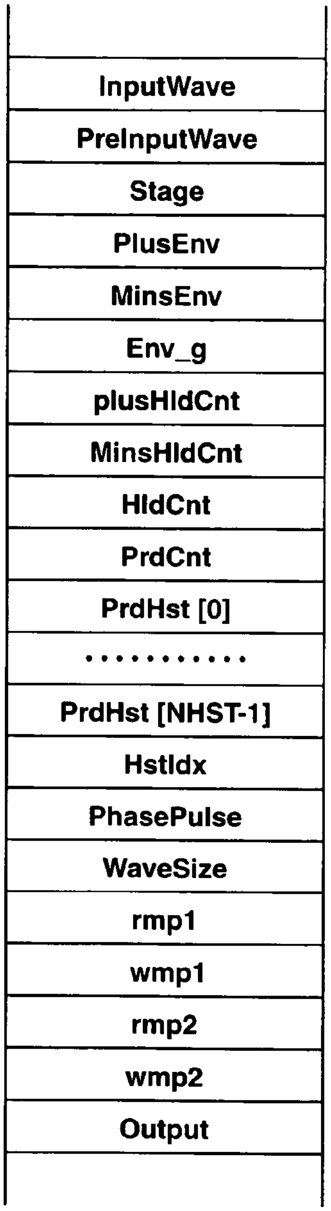
FIG. 10A illustrates control parameters stored in a RAM of FIG. 1.
Figure 10B:
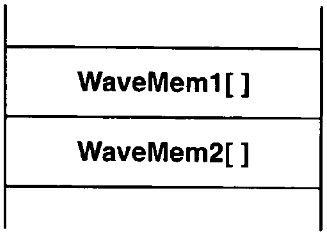
FIG. 10B illustrates waveform data stored in the RAM.

FIG. 10A shows various control parameters stored in RAM 5. FIG. 10B shows a waveform memory of RAM 5 that has stored waveform data. WaveMem 1 [ ] is a location where voice waveform data obtained by sampling a voice signal received from microphone 7 with A/D converter 8 is written and corresponds to voice waveform memory 21 of FIGS. 2 and 8. WaveMem 2 [ ] is a location where performance waveform data is written, which includes pulse waveform generated by pulse generator 24 in accordance with performance of the keyboard 2, and corresponds, to performance waveform memory 25 of FIGS. 2 and 8.

Figure 11:
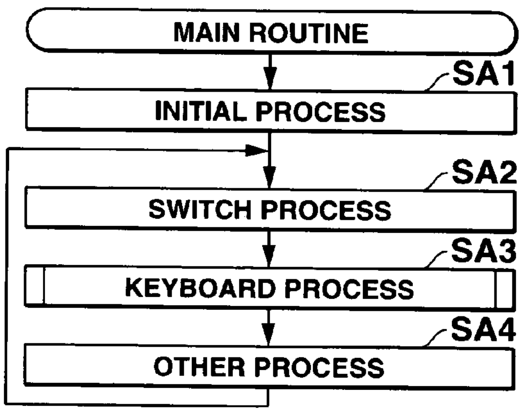
FIG. 11 is a flowchart of a main routine to be executed by a CPU of FIG. 1.

The data synthesis to be performed by the first embodiment of FIG. 1-7 and the modification of FIG. 8 will be described, using a flowchart indicative of a main routine of FIG. 11. In FIG. 11, after an initial process has been performed (step SA1), a switch process that searches switch unit 3 (step SA2), a keyboard process that searches keyboard 2 (step SA3), and other processes including a display process (step SA4) are executed repeatedly. The initial process (step SA1) includes setting the control parameters of FIG. 10A initially, as shown below.

The remaining voice waveform data InputWave obtained by A/D converter 8 sampling of a voice signal obtained from microphone 7, and the voice waveform data PreInputWave preceding one sample are cleared. Remaining Stage indicative of a phase detection stage is set to zero (representing a wait for point A in FIG. 9). Remaining positive and negative envelope values PlusEnv and MinsEnv of the voice waveform data are then cleared. Envelope attenuation coefficient Env_g is set to a predetermined positive value less than 1. Hold counters PlusHldCnt and MinsHldCnt for the positive and negative envelope values, respectively, are cleared. Attenuation halt time HldCnt that is also a criterion value with which the respective positive and negative hold counter values are compared is set to zero. A period counter PrdCnt is cleared. PrdHst [ ] that has stored the values of the period counter in the nearest past the number of which values is denoted by NHST is cleared. An index Hstldx that specifies PrdHst [ ] is set to zero. PhasePulse that represents the state of a phase sync pulse is set to zero (representing no phase sync point). The memory size of voice waveform memory 21 is stored in WaveSize. A read pointer rmp 1 for voice waveform memory 21, a write pointer WMP 1 for voice waveform memory 21, a read pointer rmp 2 for performance waveform memory 25, and a write pointer rmp 2 for voice waveform memory 25 are all set to zero. Output data Output is cleared. WaveMem 1 [ ] and WaveMem 2 [ ] of FIG. 10B are cleared.

Figure 12:
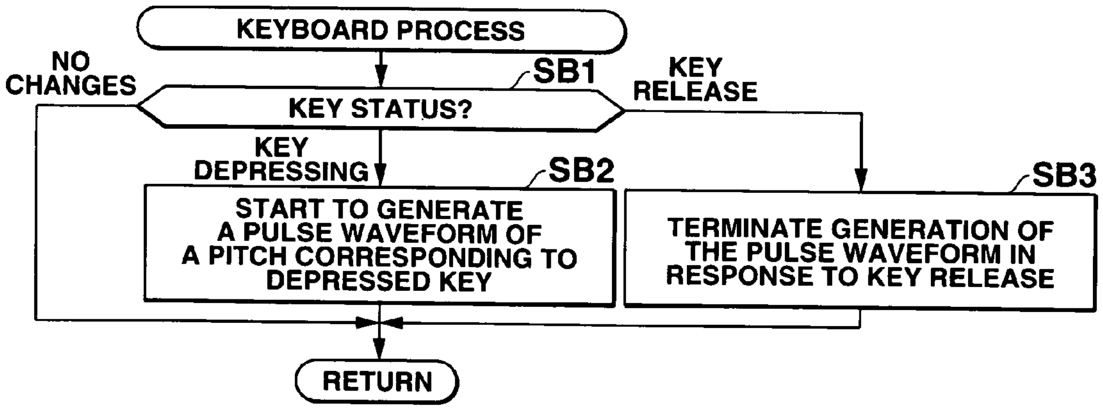
FIG. 12 is a flowchart of a keyboard process to be performed in the main routine of FIG. 11.

FIG. 12 is a flowchart of the keyboard process in step SA3 of the main routine. Keyboard 2 is searched to see whether the respective keys are depressed, released or undepressed (SB 1). When any key is depressed, a pulse waveform of a pitch corresponding to the key starts to be generated (step SB 2). When any key is released in step SB1, generation of the pulse waveform of that pitch is terminated (step SB3). After generation of the pulse waveform in step SB2, after termination of the generation of the pulse waveform in step SB3, or when there are no changes in keyboard 2 in step SB1, control returns to the main routine.

Figure 13:
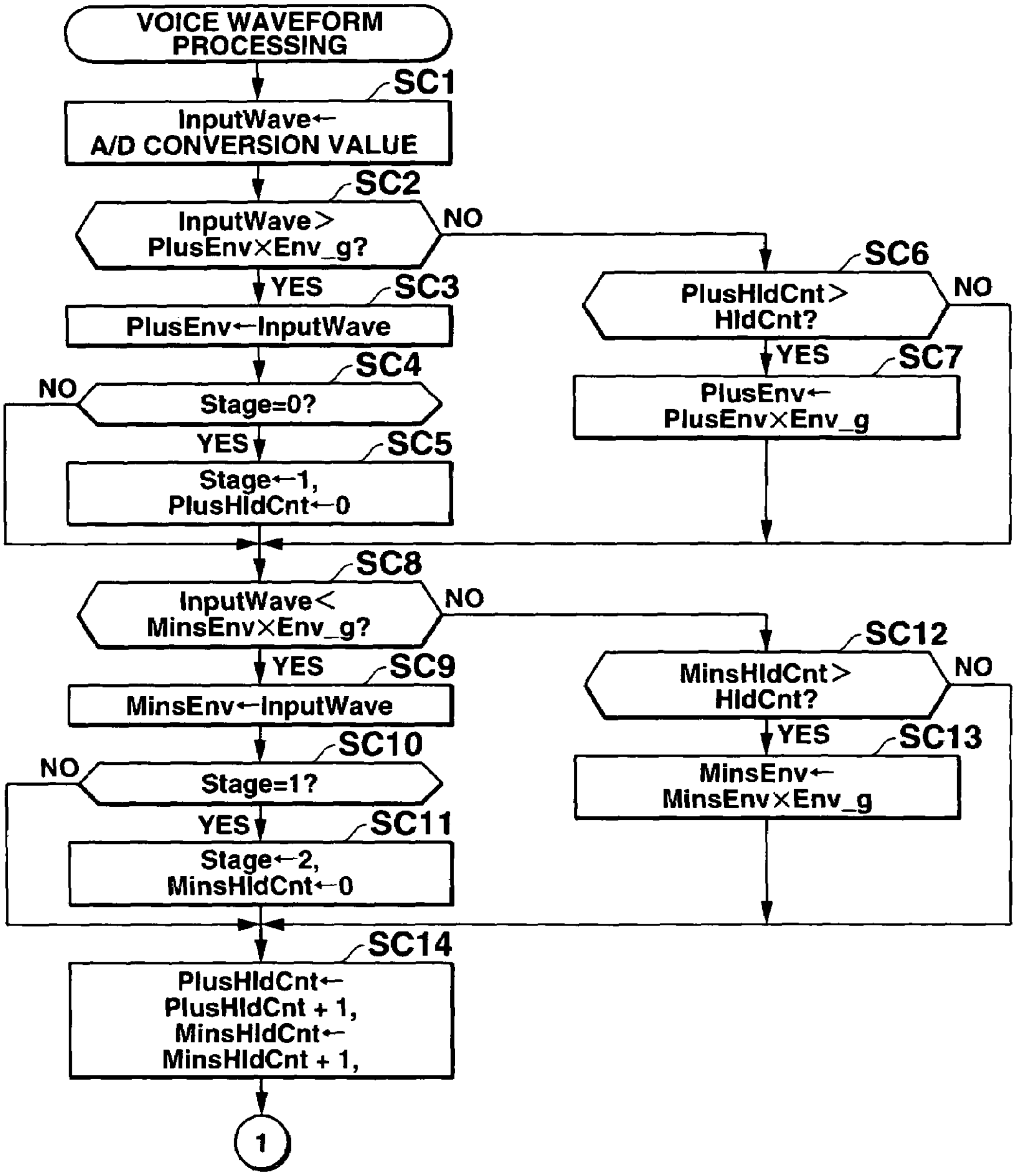
FIG. 13 is a flowchart of a voice waveform process to be executed in response to input of voice waveform data due to sampling by an A/D converter in FIG. 1.
Figure 14:
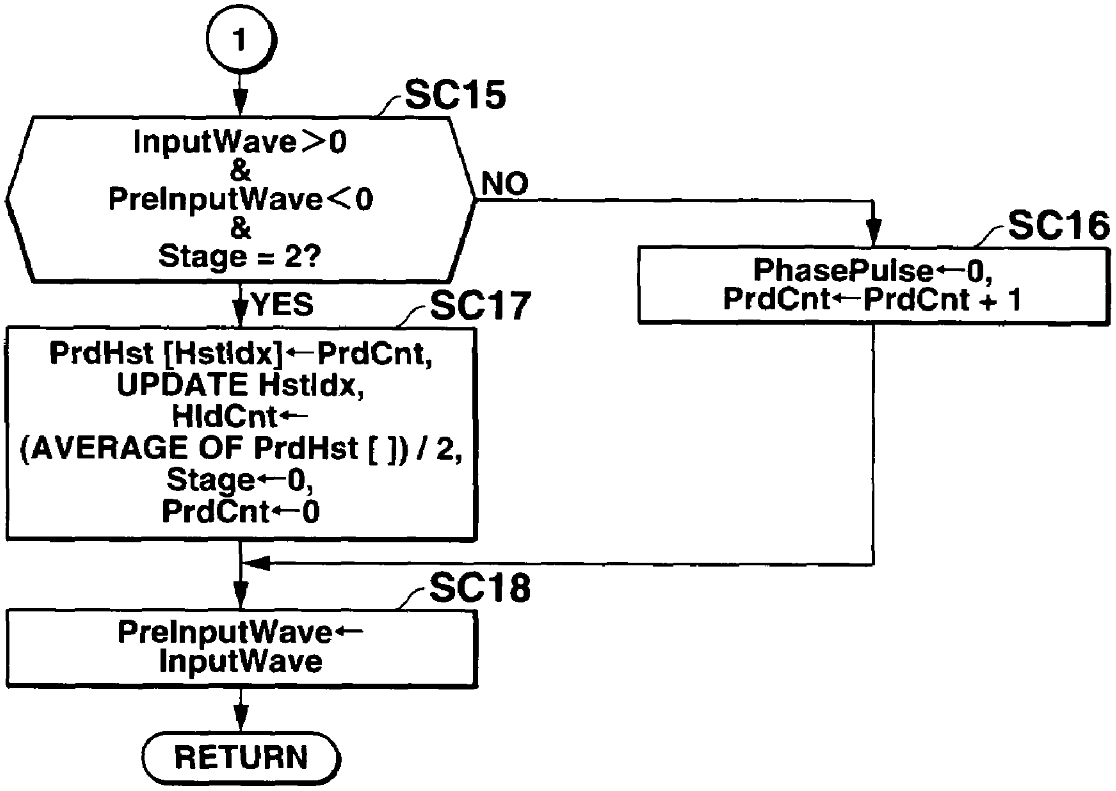
FIG. 14 is a flowchart of a part of the voice waveform process to be continued from FIG. 13.

FIGS. 13 and 14 are a flowchart of a voice waveform process to be executed in response to an interrupt comprising reception of voice waveform data sampled by A/D converter 8. In FIG. 13, an A/D conversion value is stored in InputWave (step SC1). Then, it is determined whether the amplitude of InputWave is greater than the product of a positive envelope value PlusEnv and attenuation coefficient Env_g (step SC2). That is, it is determined whether point A has been exceeded in FIG. 9. If so, a positive value of InputWave is stored in PlusEnv (step SC3). Then, PlusEnv increases following a positive increasing value of InputWave until the positive value of InputWave reaches a peak, after which PlusEnv maintains its peak value only for a given time HldCnt.

It is then determined whether Stage is zero (step SC4). If so (representing a wait for point A), Stage is set to 1 (representing a wait for point B). Then, PlusHldCnt is cleared to zero (step SC5). When in step SC2 the positive value of InputWave is less than the product of PlusEnv and Env_g, or a positive value of InputWave has not exceeded point A, it is determined whether the count of PlusHldCnt has exceeded the value of HldCnt (step SC6). If so, that is, when the attenuation halt time has passed, PlusEnv is multiplied by Env_g and then PlusEnv is attenuated (step SC7).

After the processing in step SC5 or SC7, when Stage is not zero in step SC4, or when the count value of PlusHldCnt has not been exceeded, it is determined whether InputWave is less than the product of MinsEnv, which represents a negative value of the InputWave, and attenuation coefficient Env_g (step SC8), or exceeded point B in FIG. 9. If so, or when the negative value of InputWave is less than point B, a negative value of InputWave is stored in MinsEnv (step SC9). Thus, then MinsEnv decreases following a decreasing negative value of InputWave until the negative value of InputWave reaches its peak, after which MinsEnv maintains its peak value only for a given time HldCnt.

Then, it is determined whether Stage is 1 (SC10). If so (representing a wait for point B), Stage is set to 2 (representing a wait for point C) and MinsHldCnt is then cleared to zero (step Sc11). When in step SC8 the negative value of InputWave is greater than the product of MinsEnv and Env_g, or has not exceeded point B, it is determined whether the count of MinsHldCnt has exceeded the value of HeldCnt (step SC12). If so, or when the attenuation halt time has passed, MinsEnv is multiplied by Env_g and then MinsEnv is further attenuated (step SC13).

After the processing in step SC11 or SC 13, or when Stage is not 1 in step SC10 or when the count of MinsHldCnt has not exceeded the value of HldCnt, the counts of PlusHldcnt and MinsHldCnt are then incremented, respectively (step SC14).

Then, in FIG. 14 it is determined whether the latest sampled waveform data InputWave, preceding sampled waveform data PreInputWave and Stage are positive, negative and 2 (representing a wait for point C), respectively (step SC15). If so, it is implied that point C that represents a zero crosspoint where the value of the voice waveform data changes from negative to positive has been detected. If zero crosspoint C has not been detected, PhasePulse is reset to zero (not representing the phase sync point) and the count of PrdCnt is incremented (step SC16). When zero crosspoint C is detected in step SC15, the period counter value PrdCnt is stored in PrdHst [HstIdx], thereby updating the value of HstIdx, and half of an average value of PrdHst[0]—PrdHst [NHST-1] is stored in HldCnt, thereby updating the attenuation halt time. Then, PhasePulse is set to 1 (representing the phase sync point), Stage is set to zero (representing a wait for point A) and PrdCnt is cleared to zero (step SC17). After the processing in step SC16 or SC17, the latest sample voice waveform data InputWave is stored in PreInputWave in preparation for next voice signal processing (step SC18). Control then returns to the main routine.

Figure 15:
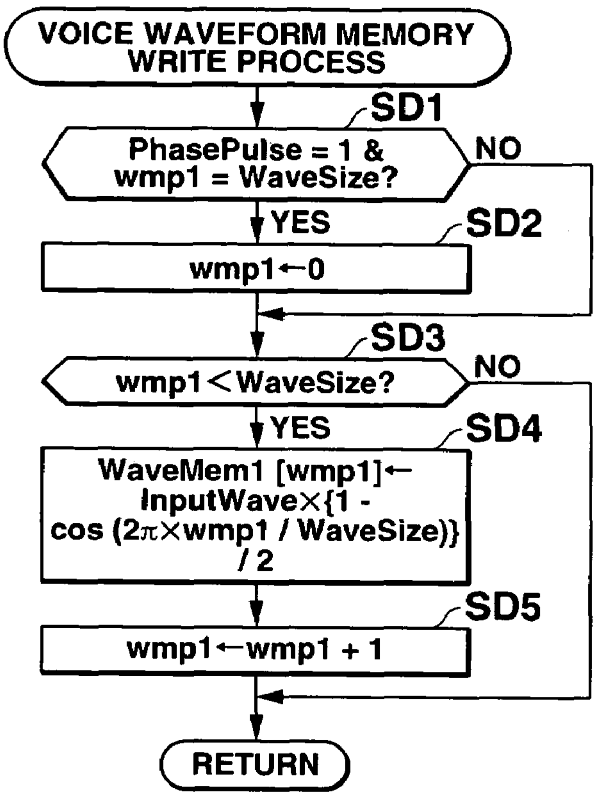
FIG. 15 is a flowchart of a voice waveform memory write process to be performed by a write controller of FIG. 8.

FIG. 15 is a flowchart of a voice waveform memory writing process to be performed by write controller 23 of FIG. 8. It is determined whether PhasePulse is 1 (representing the phase sync point) and wmp 1 represents WaveSize (step SD1), or whether a periodic pulse of FIG. 9 representing the start of the period of the voice waveform data is received from period detector 22 and the last address of voice waveform memory 21 has been exceeded. If so, wmp 1 is set to 0 representing the head address (step SD2). Then, it is determined whether wmp 1 is smaller than WaveSize (step SD3), or whether the write pointer has not exceeded the last address. If so, a window function operation is performed on the voice waveform data and a window function output read from window function table 27 as follows:

$$\text{InputWave}\times\{1-\cos 2\pi\times wmp\ 1/\text{WaveSize}\}/2$$

and a resulting value is stored in WaveMem 1 [wmp 1] (step SD4). Then, the value of wmp 1 is incremented (step SD5) and then control returns to the main routine.

Figure 16:
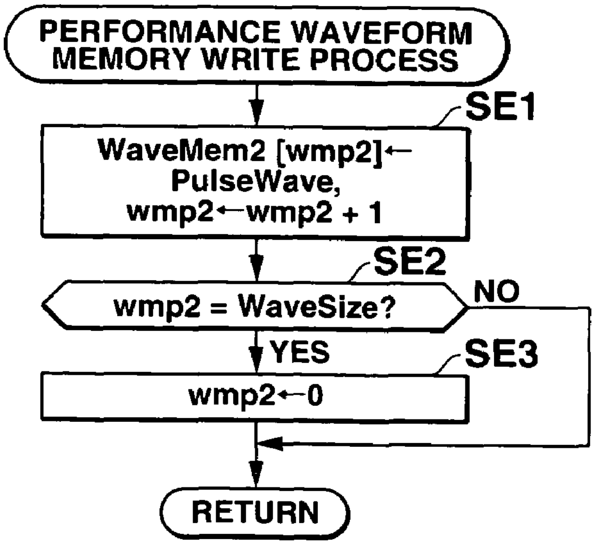
FIG. 16 is a flowchart of a performance waveform memory write process to be performed by a pulse generator of FIG. 8.

FIG. 16 a flowchart of an interrupt process occurring in accordance with performance of keyboard 2 of FIG. 1, and comprising writing performance waveform data into performance waveform memory 25 by pulse generator 24 of FIG. 8. A pulse waveform PulseWave produced depending on the pitch of the performance waveform is written into a location WaveMem 2 [wmp 2] indicated by a write pointer wmp 2, and then wmp 2 is incremented (step SE1). Then, it is determined whether write pointer wmp 2 has exceeded the last address of performance waveform memory 25 (step SE2). If so, wmp 2 is set to zero representing the head address of performance waveform memory 25 (step SE3). Control then returns to the main routine.

Figure 17:
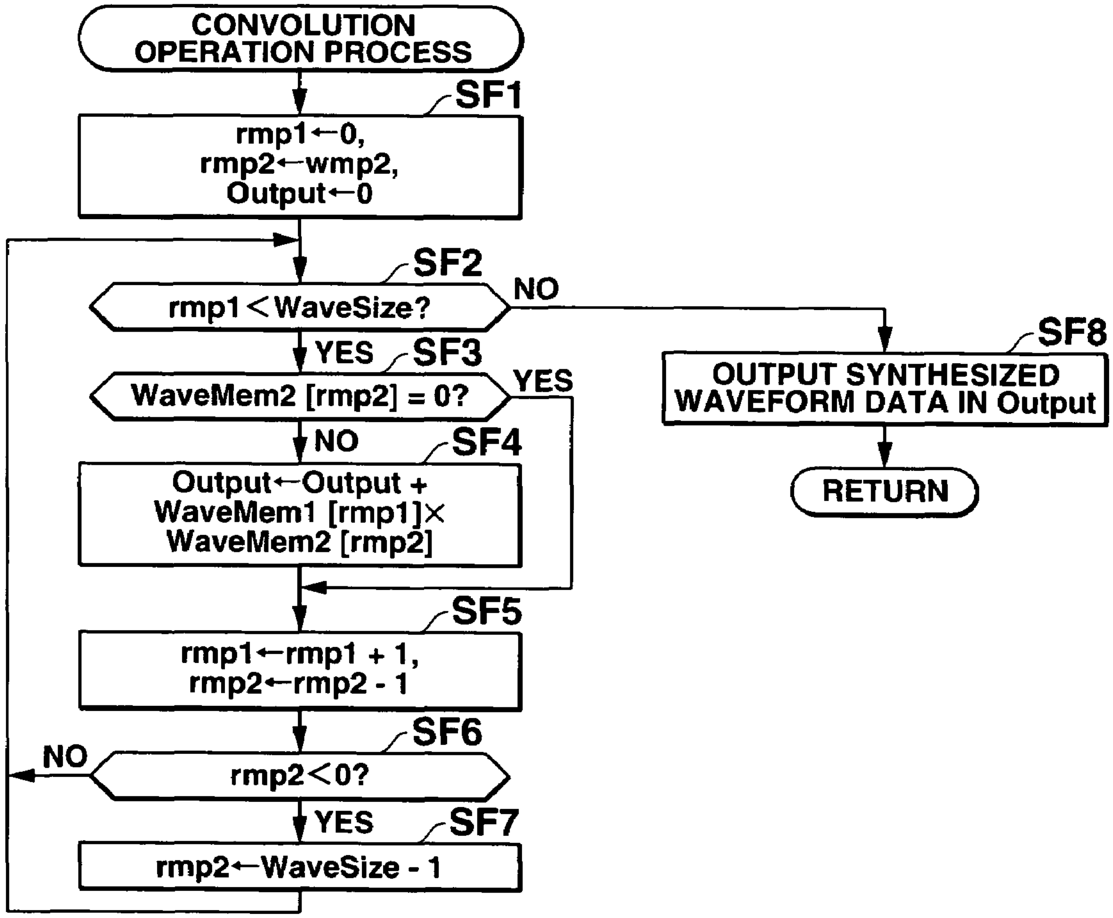
FIG. 17 is a flowchart of a convolution operation process to be performed by a convolution operation unit of FIG. 8.

FIG. 17 is a flowchart of a convolution operation process that will be performed by convolution operation unit 26 of FIG. 8. First, read pointer rpm 1 for voice waveform memory 21 is set to zero representing its head address. Then, read pointer rmp 2 for performance waveform memory 25 is set to the present write pointer wmp 2 that has completed its writing, and then Output is cleared (step SF1). It is then determined whether read pointer rmp 1 for voice waveform memory 21 is smaller than WaveSize (step SF2), or whether voice waveform data to be operated on remains in voice waveform memory 21. If so, it is then determined whether WaveMem 2 [rmp 2] is zero (step SF3), or pulse waveform data, which is the performance waveform data indicated by read pointer rmp 2, and which is to be operated along with the voice waveform data, is 0 in performance waveform memory 25.

If not, voice waveform data WaveMem 1 [rmp 1] indicated by read pointer rmp 1 for voice waveform memory 21 is multiplied by waveform data WaveMem 2 [rmp 2] indicated by read pointer rmp 2 for performance waveform memory 25, and resulting synthesis waveform data is then accumulated in Output (step SF4). Then, or when WaveMem 2 [rmp 2] is zero in step SF3, or performance waveform data to be subjected to convolution operation along with the voice waveform data, is zero in voice waveform memory 21, read pointer rmp 1 for voice waveform memory 21 is incremented and read pointer rmp 2 for performance waveform memory 25 is decremented (step SF5).

Then, it is determined whether rmp 2 is negative (step SF6), or the read pointer for performance waveform memory 25 is decremented past the head read address. If not, control passes to step SF2 to repeat a looping operation concerned. When rmp 2 becomes negative in step SF 6, or the read pointer for performance waveform memory 25 is decremented past the head read address, WaveSize-1 representing the last read address of performance waveform memory 25 is set in rmp 2 (step SF7). Control then passes to step SF2, thereby repeating the looping operation concerned. When in step SF2 read pointer rmp 1 for voice waveform memory 21 reaches WaveSize, or all the voice waveform data stored in voice waveform memory 21 is read out and the corresponding convolution operation process is terminated, Output data, or synthesized waveform data, is outputted (step SF8). Control then returns to the main routine.

As described above, according to the first embodiment, CPU 1 functions as write controller 23 of FIG. 2 or 8 that writes to voice waveform memory 21 voice waveform data including period information received from A/D converter 8 in accordance with the human being's voice signal received from microphone 7, causes pulse generator 24 to generate a pulse waveform of a specified period corresponding to a pitch of a musical sound involving a key depressed at the keyboard 2, writes the pulse waveform into performance waveform memory 25, and causes convolution operation unit 26 to perform the convolution operation on the voice waveform data of voice waveform memory 21 and the pulse waveform of performance waveform memory 25, thereby outputting resulting synthesized waveform data.

Thus, when even voice waveform data obtained from microphone 7 is synthesized with performance waveform data without phase discrepancy, based on the keynote of the voice waveform data, synthesized waveform data of a relevant pitch having a formant of the human being's voice is let off as a distortionless sound.

The voice waveform data is always stored in voice waveform memory 21, starting with its part corresponding to the detected start of the period. Therefore, as shown in FIG. 7, when one voice waveform memory is overwritten with voice waveform data, discontinuity of the voice waveform data is low around an address indicated by the write pointer when the voice waveform is stabilized. Hence, the waveform synthesis operation is realized without using a plurality of voice waveform memories.

In this case, CPU 1 multiplies the voice waveform data including period information and involving the convolution operation by a window function output of Hanning window stored in window function table 27, as shown in FIG. 2 or 8, thereby producing synthesized waveform data of improved quality. Then, this waveform data is stored in voice waveform memory 21.

Alternatively, when performing a convolution operation on the voice waveform data and the pulse waveform data produced due to musical performance as shown in FIG. 2, CPU 2 multiplies these data by a window function output of Hanning window stored in window function table 27.

CPU 1 acts as the period detector 22 of FIG. 2 or 8 that detects the start of the period of the voice waveform data and then stores the voice waveform data in voice waveform memory 21, starting with its part corresponding to the start of the period. Thus, voice waveform data having a formant indicative of the features of the human being's voice is synthesized with the performance waveform data.

CPU 1 also functions as period detector 22 of FIG. 2 or 8 that multiplies voice waveform data, of any pitch having a formant indicative of the features of the human being's voice, by window function outputs over at least one period of the voice waveform data after the detected start of this period.

As shown in FIGS. 3 and 9, CPU 1 also functions as period detector 22 of FIG. 2 or 8 that produces positive and negative attenuating peak hold values for positive and negative envelopes of the voice waveform data, sequentially detects point a where the positive peak hold value attenuating with attenuation coefficient Env_g intersects with the positive voice waveform data, point B where the negative peak hold value attenuating with attenuation coefficient Env_g intersects with the negative voice waveform data, and a zero crosspoint C where the voice waveform data changes from negative to positive, thereby detecting the start of the period of the voice waveform data. Thus, only the period of the keynote included in the voice waveform data excluding the overtones can be detected.

Alternatively, as shown in FIG. 9, CPU 1 may detect point a where the positive increasing voice waveform data intersects with the peak hold value for the positive envelope of the voice waveform including period information and starting to attenuate with attenuation coefficient Env_g a given time HldCnt after the peak of the positive envelope of the voice waveform data, point b where the negative increasing voice waveform intersects with the peak hold value for the negative envelope of the voice waveform and starting to attenuate with attenuation coefficient Env_g a given time HldCnt after the peak of the negative envelope of the voice waveform data. Thus, even when the amplitudes of overtones included in the voice waveform are relatively large, it is ensured that only the period of the keynote is detected.

In this case, CPU 1 dynamically sets half of an average of up to the last detected period as a new given time HldCnt for the peak hold, as shown in step SC17 in FIG. 14. Thus, it is ensured that even when the pitch or period of a voice inputted to microphone 7 is fluid, period detector 22 is capable of flexibly following a resulting voice waveform, thereby detecting its period.

CPU 1 detects as the start of the period of the voice waveform a zero crosspoint where the voice waveform changes from negative to positive. Thus, as shown in FIGS. 4A and 4B, it is ensured that the voice waveform data is written into voice waveform memory 21 from the zero crosspoint as the start of the period.

Second Embodiment

Referring to FIGS. 18-22, an electronic keyboard instrument of a second embodiment of the present invention will be described. The electronic keyboard instrument has the same structure as that of the first embodiment of FIG. 1 excluding a part thereof that will be described below.

Figure 18:
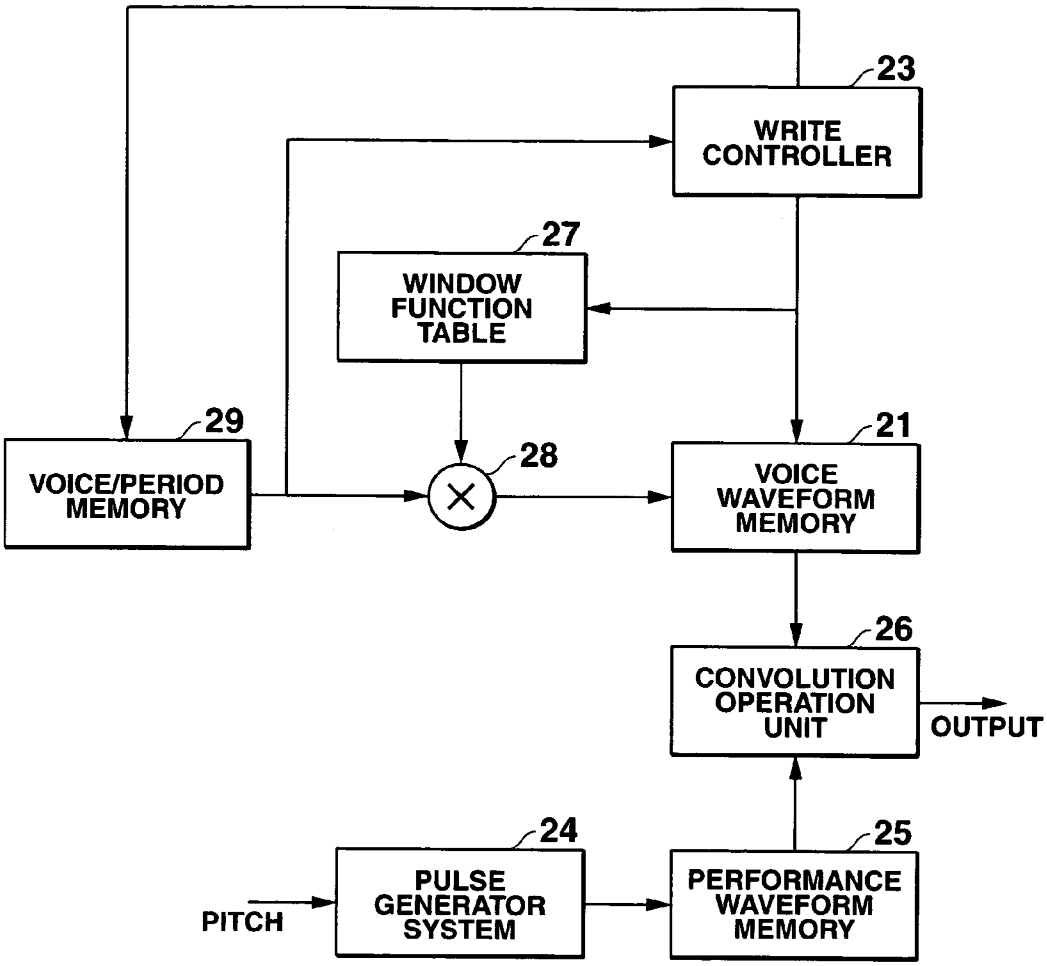
FIG. 18 is a block diagram of a data synthesis function in a second embodiment.
Figure 19:
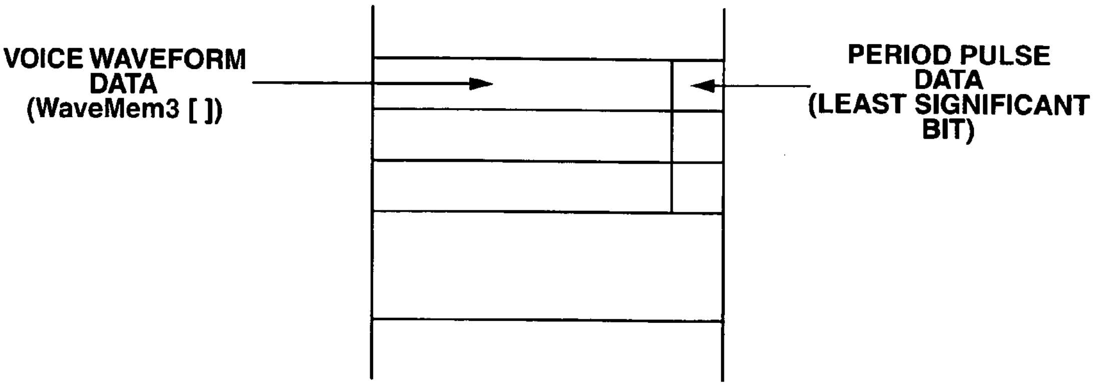
FIG. 19 illustrates the composition of voice waveform data stored in a voice/period memory of FIG. 18.
Figure 20:
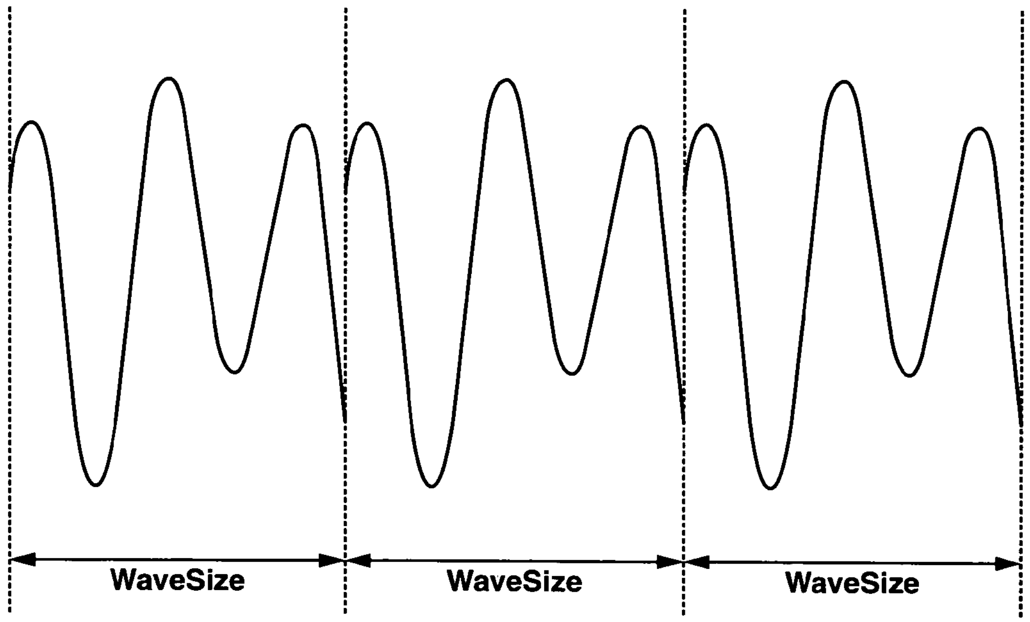
FIG. 20 illustrates impulse responses of voice waveform data extracted in the size of the voice waveform memory of FIG. 18.

FIG. 18 is a block diagram of a data synthesis function of the keyboard instrument. In FIG. 18, a voice/period memory 29 is provided which has stored voice waveform data (Wavemem 3 [ ]) and periodic pulse data representing the least significant bit of the voice waveform data, as shown in FIG. 19. In this case, as shown in FIG. 20 successive voice waveform data extracted beforehand as an impulse response in the memory size WaveSize of voice waveform memory 21 are stored in voice/period memory 29, thereby omitting storage of period information. Thus, unlike the data synthesis function of FIGS. 2 and 8, any one of elements such as A/D converter 8 and period detector 22 need not be provided. Unlike in the RAM of the first embodiment shown in FIG. 10A, no registers need be provided to detect the period of the voice waveform. The remaining structure is identical to that of FIG. 8 and further description thereof will be omitted.

The data synthesis operation by the second embodiment will be described with reference to a flowchart of FIG. 21 that indicates voice waveform processing to be executed by CPU 1. A main routine, a key process, a voice waveform memory writing process, a performance waveform memory writing process, and a convolution operation process to be performed by CPU 1 in this embodiment are identical to those shown in FIGS. 11, 12 and 15-17, and further description thereof will be omitted.

Figure 21:
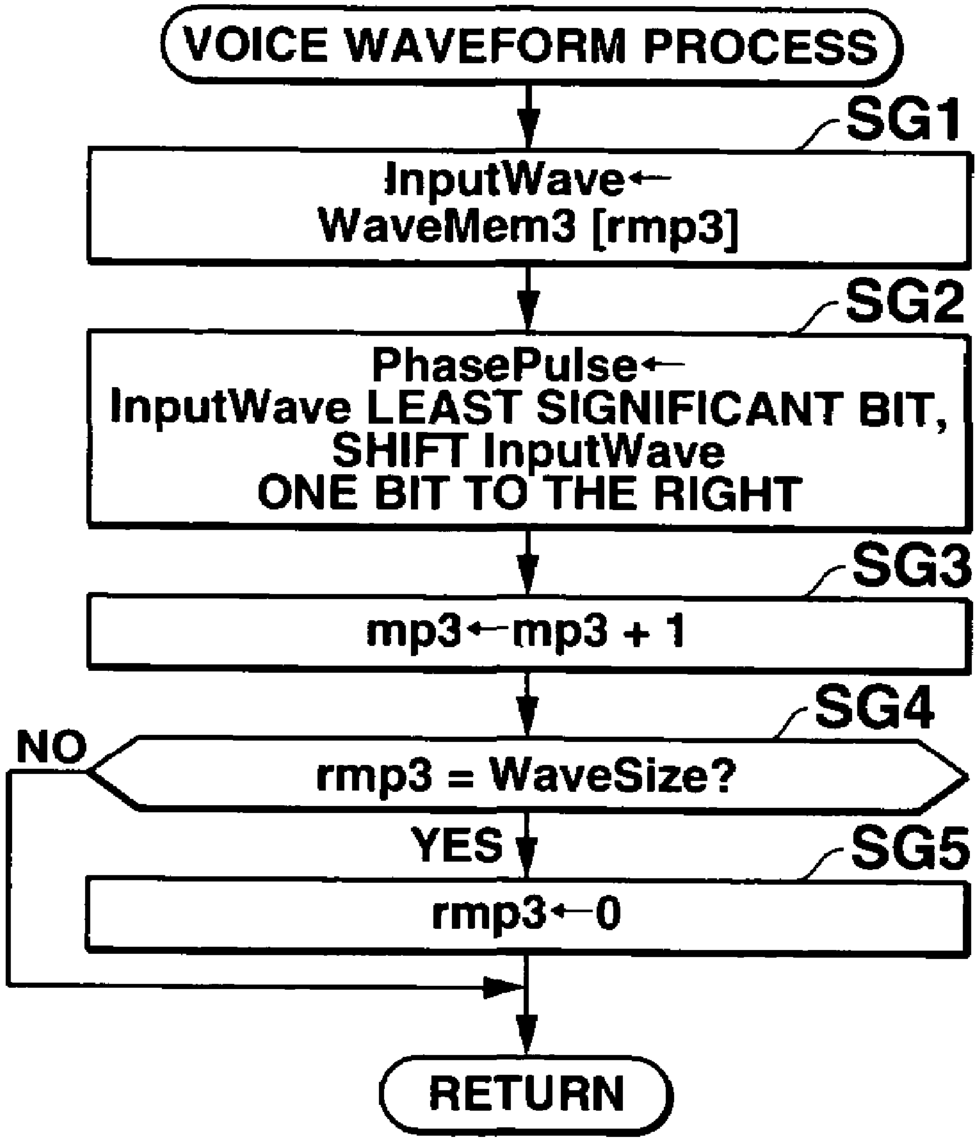
FIG. 21 is a flowchart of a voice waveform process to be performed in the second embodiment.

In FIG. 21, voice waveform data WaveMem 3 [rmp 3] in voice/period memory 29 indicated by read pointer rmp 3 is stored in RAM InputWave of FIG. 10A (step SG1). Then, the least significant bit of InputWave is set in PhasePulse in RAM 5 and the InputWave is shifted one bit to the right (step SG2), or the period pulse data included in WaveMem 3 [rmp 3] is erased, thereby leaving only the voice waveform data. Then, rmp 3 is incremented (step SG3). Then, it is determined whether rmp 3 is WaveSize (step SG4), or whether read pointer rmp 3 has exceeded the last address of voice/period memory 29. If so, zero or the head address is set in rmp 3 (step SG5). Thereafter, or when rmp 3 is not WaveSize and has not exceeded the last address, control then returns to the main routine.

As described above, the second embodiment comprises voice/period memory 29 that has stored the period information on the voice waveform. CPU 1 stores in voice waveform memory 21 voice waveform data for at least one period read out from voice/period memory 29. Thus, no period detection need be performed, thereby increasing the data synthesis speed.

In the second embodiment, CPU 1 multiplies the voice waveform data read out from voice/period memory 29 by the corresponding window function output and stores resulting data in voice waveform memory 21.

Figure 22:
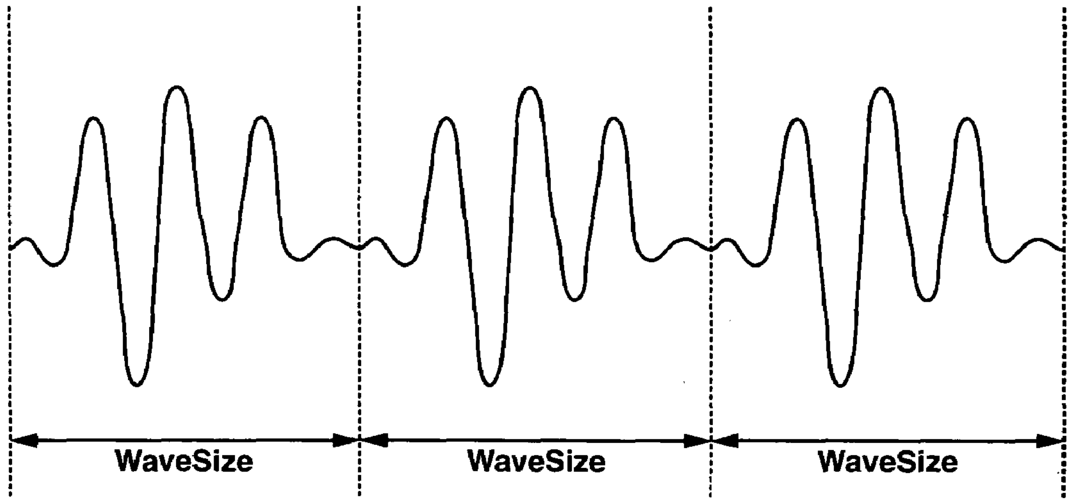
FIG. 22 illustrates the products of window function outputs and corresponding impulse responses of the voice waveform data extracted in the size of the voice waveform memory of FIG. 18.

Alternatively, as shown in FIG. 22, it may arranged that impulse responses of voice waveform data extracted successively in the memory size WaveSize of the voice waveform memory 21 are multiplied by corresponding window function outputs, respectively, and resulting data are then stored successively in voice/period memory 29, which leads to omitting window function table 27 of FIG. 18. In addition, various human being's voices, syllables, songs, etc., may be beforehand stored as sound data for the vocoder in voice/period memory 29 such that voice waveform data involving a desired sound selected by a performer and performance waveform data produced by performance of keyboard 2 can be synthesized.

As shown by the processing in steps SF3-SF5 of the FIG. 17 flowchart in the first and second embodiments, CPU 1 acts as a convolution operation unit 26 that includes sequentially incrementing the address of voice waveform memory 21 (shown by read pointer rmp 1), sequentially decrementing the address of performance waveform memory 25 (shown by read pointer rmp 2), thereby specifying addresses sequentially, and only when a pulse waveform is stored at an address specified in performance waveform memory 25, and performing a convolution operation on the pulse waveform and the voice waveform data having the address specified by voice waveform memory 21.

While in the first and second embodiments the present invention has been illustrated using as an example the performance waveform data produced by keyboard 2 as the object that will be subjected to the convolution operation along with the voice waveform data, such object is not limited to the performance waveform data shown in the embodiments. Alternatively, any data synthesis apparatus is applicable as long as it can perform a convolution operation on voice waveform data and either performance data prepared based on automatic performance data read out from memory means such as a melody memory or performance waveform data produced based on MIDI data received from an external MIDI device. That is, if apparatus have a structure that is capable of performing a convolution operation on voice waveform data and any performance waveform data including pulse waveforms produced based on a specified pitch, they can be regarded as embodiments according to the present invention.

While in the first and second embodiments the inventive data synthesis apparatus have been illustrated, using the electronic keyboard instrument as an example, the present invention is not limited to these electric keyboard instruments. For example, electronic tube instruments, electronic stringed instruments, synthesizers and all other instruments such as vibraphones, xylophones and harmonicas that are capable of electronically producing pitches of musical sounds can constitute the inventive data synthesis apparatus.

While in the embodiments the inventions of the apparatus in which CPU 1 executes the musical-sound control program stored in ROM 4 have been-illustrated, the present inventions may be realized by a system that comprises a combination of a general-purpose personal computer, an electronic keyboard device, and an external sound source. More particularly, a musical-sound control program stored in a recording medium such as a flexible disk (FD), a CD or an MD may be installed in a non-volatile memory such as a hard disk of a personal computer or a musical-sound control program downloaded over a network such as the Internet may be installed in a non-volatile memory such that the CPU of the personal computer can execute the program. In this case, an invention of the program or a recording medium that has stored that program is realized.

The program comprises the steps of: detecting the start of a period of voice waveform data; storing the voice waveform data in a first storage device, starting with its part corresponding to the start of the period detected in the detecting step; storing in a second storage device musical-sound waveform data including information on pulses having a specified period; and performing a convolution operation on the voice waveform data stored in the first storage device and the musical-sound waveform data stored in the second storage device, thereby providing synthesized waveform data synchronized with the specified period of the musical-sound waveform data stored in the second storage device.

The program may further comprise the step of: operating the output of a window function stored in a third storage device on the waveform data which is subjected to the convolution operation to be performed in the convolution operation performing step.

The window function output operating step may operate the window function output on the voice waveform data, and the waveform data storing step may store in the first storage device the voice waveform data operated in the window function output operating step.

The window function output operating step may operate the window function output over at least one period of the voice waveform data, starting with the start of the period of the waveform data detected in the detecting step.

The detecting step may produce positive and negative peak hold values of the voice waveform data, and sequentially detect a first point where an amplitude of the voice waveform data intersects with the positive peak hold value, a second point where the voice waveform data intersects with the negative peak hold value, and a zero crosspoint where the voice waveform data changes from negative to positive, thereby detecting the start of the period of the voice waveform data.

The respective positive and negative peak hold values may attenuate with a predetermined attenuation coefficient.

The positive and negative peak hold values may attenuate with a predetermined attenuation coefficient since a given time has passed after positive and negative peaks of the voice waveform data.

The may further comprise a fourth storage device that has stored voice waveform data that can include identification information indicating the start of the period of the voice waveform data, and when the voice waveform data read from the fourth storage device comprises identification information indicating the start of the period of the voice waveform data, the voice waveform data storing step may store in the first storage device voice waveform data for at least one period including the identification information.

The window function output operating step may operate the window function output stored in the third storage device on the voice waveform data read from the fourth storage device, and the voice waveform data storing step may store in the first storage device the voice waveform data operated on in the window function output operating step.

The voice waveform data storing step may read out from the fourth storage device voice waveform data on which the window function output is operated beforehand and then store the voice waveform data in the first storage device.

The convolution operation performing step may sequentially increment an address of the first storage device, sequentially decrement an address of the second storage device, thereby specifying the addresses sequentially, and only when the musical-sound waveform data is stored at the specified address in the second storage, perform the convolution operation on the musical-sound waveform data and the voice waveform data stored at the specified address in first storage device.

Various modifications and changes may be made thereto without departing from the broad spirit and scope of this invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. A data synthesis apparatus comprising:

a period detector for detecting a start of a period of voice waveform data;

a first storage device;

a first storage control unit for storing the voice waveform data in the first storage device, starting with a part corresponding to the start of the period detected by the period detector;

a second storage device;

a second storage control unit for storing in the second storage device musical-sound waveform data including information on pulses having a specified period;

a convolution operation unit for performing a convolution operation on the voice waveform data stored in the first storage device and the musical-sound waveform data stored in the second storage device, thereby providing synthesized waveform data synchronized with the specified period of the musical-sound waveform data stored in the second storage device;

an additional storage device which stores voice waveform data that can include identification information indicating the start of the period of the voice waveform data, and wherein when the voice waveform data read from the additional storage device comprises identification information indicating the start of the period of the voice waveform data, the first storage control unit stores in the first storage device voice waveform data for at least one period including the identification information;

wherein the additional storage device stores voice waveform data on which a window function output is operated beforehand.

2. A data synthesis apparatus comprising:

a period detector for detecting a start of a period of voice waveform data;

a first storage device;

a first storage control unit for storing the voice waveform data in the first storage device, starting with a part corresponding to the start of the period detected by the period detector;

a second storage device;

a second storage control unit for storing in the second storage device musical-sound waveform data including information on pulses having a specified period;

a convolution operation unit for performing a convolution operation on the voice waveform data stored in the first storage device and the musical-sound waveform data stored in the second storage device, thereby providing synthesized waveform data synchronized with the specified period of the musical-sound waveform data stored in the second storage device;

wherein the convolution operation unit sequentially increments an address of the first storage device, sequentially decrements an address of the second storage device, thereby specifying the addresses sequentially, and only when the musical-sound waveform data is stored at the specified address in the second storage, performs the convolution operation on the musical-sound waveform data and the voice waveform data stored at the specified address in first storage device.

* * * * *